(12) United States Patent
Iwami

(10) Patent No.: US 9,071,081 B2
(45) Date of Patent: Jun. 30, 2015

(54) POWER SOURCE DEVICE FOR VEHICLE

(75) Inventor: Ryotaro Iwami, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 347 days.

(21) Appl. No.: 13/638,194

(22) PCT Filed: Mar. 28, 2011

(86) PCT No.: PCT/JP2011/001819
§ 371 (c)(1),
(2), (4) Date: Sep. 28, 2012

(87) PCT Pub. No.: WO2011/121975
PCT Pub. Date: Oct. 6, 2011

(65) Prior Publication Data
US 2013/0026828 A1   Jan. 31, 2013

(30) Foreign Application Priority Data

Mar. 31, 2010   (JP) ................................. 2010-081978
Mar. 31, 2010   (JP) ................................. 2010-081979

(51) Int. Cl.
*B60L 1/00*   (2006.01)
*B60L 3/00*   (2006.01)
(Continued)

(52) U.S. Cl.
CPC ........... *H02J 7/1423* (2013.01); *G01R 31/3679* (2013.01); *H01M 10/0525* (2013.01);
(Continued)

(58) Field of Classification Search
CPC ......................... H01M 10/482; G01R 31/3679
USPC .......... 307/9.1, 10.1, 10.6; 320/137, 140, 162
See application file for complete search history.

(56) References Cited

U.S. PATENT DOCUMENTS 6,323,608 B1 * 11/2001 Ozawa ........................... 318/139
7,405,526 B2 *  7/2008 Sato ............................... 318/139
(Continued)

FOREIGN PATENT DOCUMENTS

CN          1842719 A      10/2006
CN        101305290 A      11/2008
(Continued)

OTHER PUBLICATIONS

International Search Report for Application No. PCT/JP2011/001819 dated May 17, 2011.
(Continued)

*Primary Examiner* — Rexford Barnie
*Assistant Examiner* — Rasem Mourad
(74) *Attorney, Agent, or Firm* — Pearne & Gordon LLP

(57) ABSTRACT

A vehicle power source device which can improve the accuracy of battery deterioration detection. The vehicle power source device (100) is provided with: generator (110) which is in-built in a vehicle; high-voltage first battery (120) which stores the electricity generated by the generator (110); DC/DC converter (140) which is provided between the generator (110) and the first battery (120), and electrical component (180); second battery (130) which is connected to the first battery (120) via the DC/DC converter (140), and which has a lower voltage than the first battery (120); and power source ECU (150) which controls the DC/DC converter (140). If the current drawn from the first battery (120) satisfies predicted conditions, the power source ECU (150) increases the output voltage of the DC/DC converter, measures the parameters required to detect the deterioration of the first battery (120), and determines the deterioration of the first battery (120).

5 Claims, 17 Drawing Sheets

(51) Int. Cl.
  *H02G 3/00* (2006.01)
  *H02J 7/14* (2006.01)
  *G01R 31/36* (2006.01)
  *H01M 10/48* (2006.01)
  *H01M 10/0525* (2010.01)
  *H01M 10/34* (2006.01)

(52) U.S. Cl.
  CPC .......... *H01M10/345* (2013.01); *H01M 10/482* (2013.01); *Y02T 10/7005* (2013.01); *Y02T 10/7011* (2013.01)

(56) References Cited

U.S. PATENT DOCUMENTS

| | | | |
|---|---|---|---|
| 7,675,291 | B2 | 3/2010 | Matsuo |
| 2002/0157882 | A1* | 10/2002 | Kubo et al. ............ 180/65.3 |
| 2006/0097577 | A1* | 5/2006 | Kato et al. ............ 307/10.1 |
| 2006/0186890 | A1 | 8/2006 | Iwane et al. |
| 2006/0238168 | A1 | 10/2006 | Matsuo |
| 2007/0029974 | A1* | 2/2007 | Uchida ................ 320/132 |
| 2007/0252601 | A1 | 11/2007 | Satoh et al. |

FOREIGN PATENT DOCUMENTS

| | | | |
|---|---|---|---|
| JP | 2003-214248 A | | 7/2003 |
| JP | 2003-282156 A | | 10/2003 |
| JP | 2005-221487 A | | 8/2005 |
| JP | 2007-274873 A | | 10/2007 |
| JP | 2008-278564 A | | 11/2008 |
| JP | 2008278564 A | * | 11/2008 |
| JP | 2009-274549 A | | 11/2009 |
| JP | 2010-063267 A | | 3/2010 |
| WO | 2007/055101 A1 | | 5/2007 |

OTHER PUBLICATIONS

Office Action issued in Chinese Patent Application No. 201180016059.4 dated Apr. 8, 2014.

* cited by examiner

| CATEGORY | | CONDITION | PREDICTED ITEM |
|---|---|---|---|
| ELECTRICALLY DRIVEN COMPRESSOR | | Temperature inside vehicle rises by a certain temperature (for example, 5°C) or more in a certain time (for example, one minute) | (When air conditioner is off) User is predicted to turn on air conditioner due to rise in temperature inside vehicle |
| | | | (When air conditioner is on) User is predicted to increase air conditioner output due to rise in temperature inside vehicle |
| ELECTRICAL EQUIPMENT | ELECTRICAL EQUIPMENT WITH COMPARATIVELY HIGH POWER CONSUMPTION · HEADLIGHTS · POWER STEERING · BRAKE LIGHTS · WINDSHIELD WIPERS | Sun goes behind cloud, and sky darkens enough for value measured by illuminometer to fall to a certain value or below, for example | User turns on headlights |
| | | Route information is obtained from car navigation system, and distance to curve is predetermined value or below | Power steering operates due to turning of steering wheel |
| | | Route information is obtained from car navigation system, and vehicle speed exceeds predetermined value for taking curve when distance to curve is predetermined value or below | Brake pedal is depressed and brake lights come on |
| | | Windshield wipers are operating in wet weather | Windshield wipers operate (regularly) |

FIG.2

POWER SOURCE DEVICE FOR VEHICLE

TECHNICAL FIELD

The present invention relates to a vehicle power supply apparatus used in a car or suchlike vehicle.

BACKGROUND ART

In recent years, hybrid cars and electric cars have been attracting attention from an environmental protection viewpoint, and their development has progressed rapidly. These cars have a configuration whereby a driving force of driving the wheels is obtained by converting direct current electric power from a power supply having a secondary battery to alternating current electric power, and driving a motor by means of alternating current electric power. Normally, a hybrid car is an electric car that uses both an engine and a motor, and is a kind of electric car in a broad sense. Therefore, for convenience, in this specification the term "electric car" is used in a broad sense that includes a hybrid car unless specifically indicated otherwise.

With an electric car of this kind, there is a particular demand for the accuracy of battery deterioration detection to be improved in order to correctly ascertain travel distance, battery life, and so forth.

Conventionally, the apparatus described in Patent Literature 1, for example, has been known as a vehicle battery deterioration determination apparatus. In Patent Literature 1, a technology is disclosed whereby when an electrical load connected to a battery is used, a voltage change of a battery voltage detected thereafter is calculated, and battery deterioration determination is performed by comparing the detected voltage change with a predetermined determination value. An electrical load is, for example, an air conditioner, power steering, headlights, brake lights, a radiator fan, or the like. Voltage change is calculated as a change in voltage over a predetermined time (that is, a voltage change trend) or a drop in battery voltage for the electrical load. By means of this configuration, the technology in Patent Literature 1 enables change over time of a battery to be detected accurately as battery deterioration, and the occurrence of starting trouble, stalling, or the like due to a low battery charge to be promptly reported to the driver.

CITATION LIST

Patent Literature

PTL 1
Japanese Patent Application Laid-Open No. 2003-214248

SUMMARY OF INVENTION

Technical Problem

However, battery deterioration detection cannot be said to be performed accurately under better conditions with the above conventional battery deterioration determination apparatus. The reason for this is that with an air conditioner, power steering, headlights, or the like as an electrical load, the size of the load is limited to begin with. Consequently, a situation in which battery deterioration can be detected with a high degree of accuracy is not necessarily created merely by calculating a subsequent voltage change of a battery voltage when an electrical load of this kind is used. Therefore, there are certain limits to an improvement in the accuracy of battery deterioration detection.

It is an object of the present invention to provide a vehicle power supply apparatus that can further improve the accuracy of battery deterioration detection.

Solution To Problem

A vehicle power supply apparatus of the present invention has: a generator installed in a vehicle; a high-voltage first battery that is connected to the generator and stores electric power generated by the generator; a DC-DC converter located between electrical equipment, and a node between the generator and the first battery; a second battery that is connected to the first battery via the DC-DC converter, and that has a lower voltage than the first battery; a control section that controls operation of the DC-DC converter so that electric power is supplied to the second battery from the first battery if a condition for which drawing of a current from the first battery is predicted is satisfied; a measurement section that measures a parameter necessary to detect deterioration of the first battery, in synchronization with a control operation on the DC-DC converter by the control section; and a determination section that determines deterioration of the first battery using a measurement result of the measurement section.

Advantageous Effects of Invention

The present invention can further improve the accuracy of battery deterioration detection

BRIEF DESCRIPTION OF DRAWINGS

FIG. 2 is a drawing showing examples of conditions for which drawing of a current from the first battery is predicted are satisfied in the power supply system in FIG. 1;

DESCRIPTION OF EMBODIMENTS

Now, embodiments of the present invention will be described in detail using the accompanying drawings.

Embodiment 1

Figure 1:
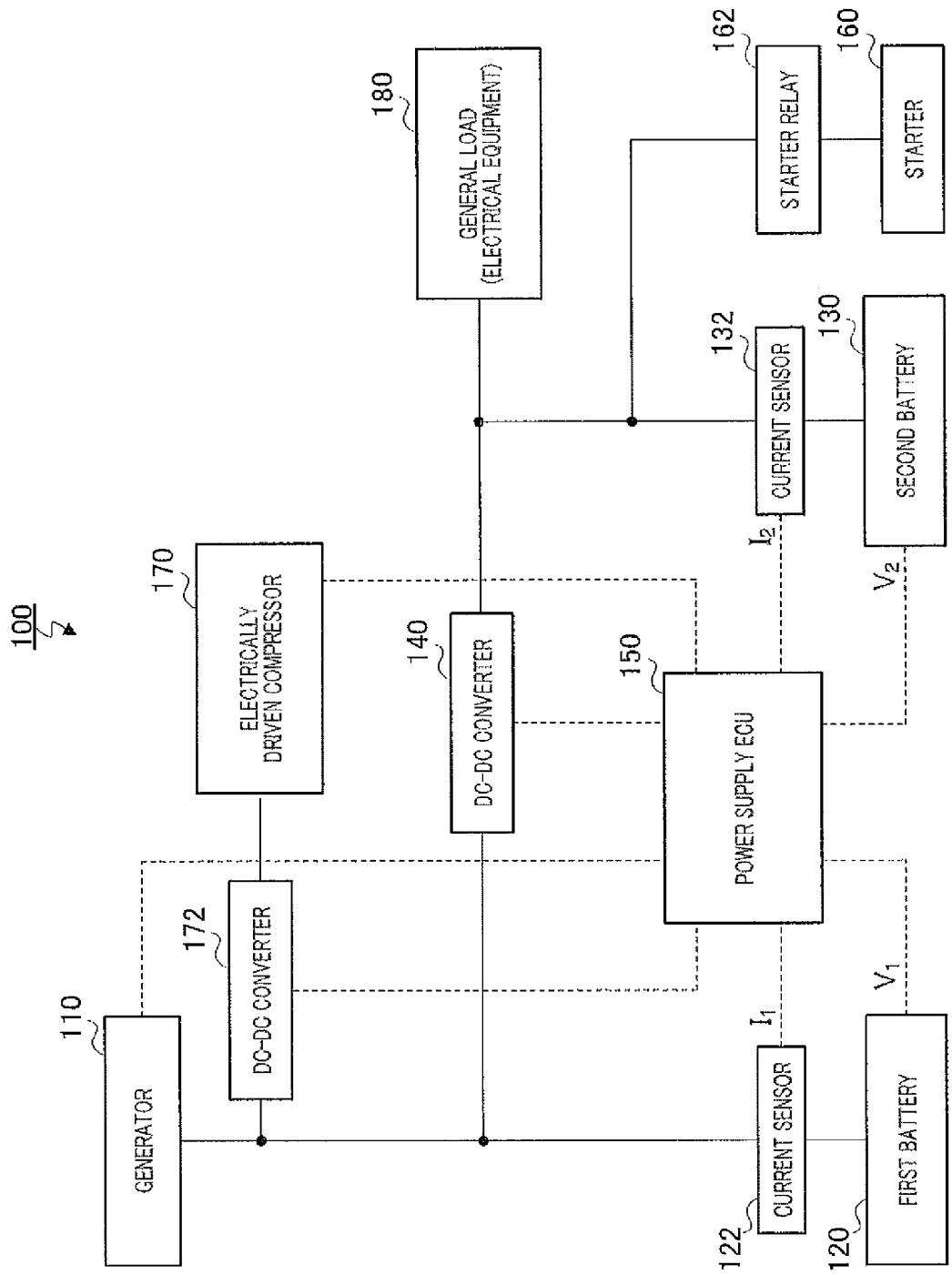
FIG. 1 is a block diagram showing a configuration of a power supply system that includes a vehicle power supply apparatus according to Embodiment 1 of the present invention.

In Embodiment 1 of the present invention, battery deterioration detection at the time of discharging will be described. FIG. 1 is a block diagram showing the configuration of a power supply system that includes a vehicle power supply apparatus according to this embodiment.

Power supply system 100 shown in FIG. 1 has generator 110, two batteries (first battery 120 and second battery 130), two current sensors 122 and 132, two DC-DC converters 140 and 172, power supply ECU (Electronic Control Unit) 150, starter 160, starter relay 162, electrically driven compressor 170, and in-vehicle other general load (electrical equipment) 180. Of the above configuration elements, two batteries 120 and 130, two current sensors 122 and 132, two DC-DC converters 140 and 172, and power supply ECU 150, compose a power supply apparatus. Below, starter 160, electrically driven compressor 170, and other general load (electrical equipment) 180 are referred to by the generic term "electrical load."

During vehicle deceleration, the rotation of the engine (not shown) is transferred to generator 110, which generates electric power and outputs regenerated energy electric power. Generator 110 is, for example, a large-capacity (for example, 150 A class) alternator with an IC regulator that is belt-driven by the engine and generates a voltage specified by power supply ECU 150 (for example, a 42 V voltage). It is also possible for generator 110 to be forcibly driven (caused to generate electric power) by means of power supply ECU 150 control as necessary other than during vehicle deceleration (forcible electric power generation). Generator 110 is connected to first battery 120 and two DC-DC converters 140 and 172.

In this embodiment, an alternator is used as generator 110, but this is not a limitation. For example, it is also possible to use a motor generator as generator 110 instead of an alternator. A motor generator is provided with the functions of both a motor and a generator in a single unit. Also, generator 110 may, for example, be connected by means of a transfer means such as a gear or belt or the like, or directly coupled, to an axle, crank axle, or the like, instead of being belt-driven by the engine.

First battery 120 is connected to generator 110 and two DC-DC converters 140 and 172, recovers and stores regenerated energy generated by generator 110 during vehicle deceleration, and supplies electric power to electric loads (mainly electrically driven compressor 170 and general load 180) and second battery 130. In order to perform regenerated energy recovery efficiently, first battery 120 should preferably be a high-voltage, high-performance battery with a large charging current and excellent chargeability. For example, first battery 120 is a nickel-hydride battery, lithium-ion battery, or the like, and generates a high voltage (for example, 36 V) so as to enable efficient charging with regenerated energy. Using a high-voltage battery makes high-voltage charging possible, and enables regenerated energy recovery to be performed efficiently. First battery 120 functions as the main battery in this system, and, as explained later herein, it is an object of this embodiment to detect deterioration of this main battery (first battery 120).

Second battery 130 is, for example, a general lead battery with a nominal voltage of 12 V, generates a voltage of 12 to 13 V, and supplies electric power to electrical loads (mainly starter 160 and general load 180). Second battery 130 receives and is charged with electric power supplied from generator 110 or first battery 120. Second battery 130 is connected to DC-DC converter 140, general load 180, and starter relay 162. Second battery 130 is not limited to a lead battery, and, for example, it is possible to use a nickel-hydride battery, lithium-ion battery, or the like instead of a lead battery.

Current sensor 122 is a current sensor for measuring the charge/discharge current of first battery 120 in order to detect the state of first battery 120, and current sensor 132 is a current sensor for measuring the charge/discharge current of second battery 130 in order to detect the state of second battery 130.

DC-DC converter 140, for example, steps down or steps up an input-side voltage in accordance with a switching operation of an internal power transistor, and supplies the resulting voltage to the output side. In this embodiment, DC-DC converter 140 mainly functions as a step-down DC-DC converter that converts an input direct current voltage (an output voltage of generator 110 or an output voltage of first battery 120) to a different, lower direct current voltage, and outputs this lower direct current voltage. For example, DC-DC converter 140 steps down an (input-side—that is, first battery 120-side) voltage of 36 V to an (output-side—that is, second battery 130-side) voltage of the order of 12 V. More specifically, for example, DC-DC converter 140 inputs a 36 V voltage as an input voltage and outputs a 12.5 to 14.5 V voltage as an output voltage. The output voltage of DC-DC converter 140 is controlled by power supply ECU 150. For example, electric power is normally supplied to general load 180 with the output voltage of DC-DC converter 140 controlled at 12.5 V, but when second battery 130 is charged, the output voltage of DC-DC converter 140 is controlled at 14.5 V. That is to say, it is possible for the output voltage of DC-DC converter 140 to be controlled in the range of 12.5 to 14.5 V in order to perform second battery 130 charging control.

On the other hand, DC-DC converter 172 mainly functions as a step-up DC-DC converter that converts an input direct current voltage (an output voltage of generator 110 or output voltage of first battery 120) to a different, higher direct current voltage, and outputs this higher direct current voltage. For example, if the rated voltage of electrically driven compressor 170 is 200 to 300 V, DC-DC converter 172 steps up a 36 V (input-side—that is, first battery 120-side) voltage to a 200 to 300 V (output-side—that is, electrically driven compressor 170-side) voltage. If a higher-voltage (for example, 200 to 300 V) battery is used as first battery 120, DC-DC converter 172 can be eliminated.

Power supply ECU 150 performs overall control of the power supply system 100. Specifically, for example, power supply ECU 150 controls the on (started)/off (stopped) state and output voltage of each of DC-DC converters 140 and 172, and also controls the on (started)/off (stopped) state and output of electrically driven compressor 170. Also, power supply ECU 150 measures the voltage and charge/discharge current of each of batteries 120 and 130, and calculates state of charge (SOC) of each of batteries 120 and 130 by means of current integration. Furthermore, power supply ECU 150 controls generator 110. Moreover, power supply ECU 150 detects deterioration of first battery 120 by simultaneously measuring (sampling) the current and voltage of first battery 120 during discharging at predetermined timing and calculating the internal resistance. In addition, power supply ECU 150 performs other controls described later herein. Details of power supply ECU 150 control will be given later herein using flowcharts in FIG. 3 onward. Power supply ECU 150 comprises a microcomputer, and more specifically, comprises, for example, a CPU (central processing unit), ROM (read only memory) that stores a program, and RAM (random access memory) for program execution.

Starter 160 is a motor used when starting (cranking) the engine. Starter 160 is also used during driving to restart the engine from an idling stop state when the vehicle has stopped. Application of a current to starter 160 is performed by turning the ignition (IG) switch (not shown), which is the engine starting switch, to the engine start position (ST position) and turning on starter relay 162.

Electrically driven compressor 170 is a compressor driven by an internal motor, and forms part of an air conditioner. The rated voltage of electrically driven compressor 170 is 200 to 300 V, for example, and it has the highest load among in-vehicle electrical loads. In this embodiment, as described later herein, electrically driven compressor 170 having the highest load is used to create a situation in which battery deterioration can be detected with a high degree of accuracy. Since electrically driven compressor 170 is driven by electricity, in many cases it is used as a set together with a regenerative system having a battery that stores regenerated energy. In a system that does not use an electrically driven compressor, other high-load electrical equipment can be used instead of an electrically driven compressor. In a system that uses an electrically driven compressor, other high-load electrical equipment can of course be used together with the electrically driven compressor.

General load 180 is, for example, a light or lamp, windshield wipers, audio equipment, a car navigation system, an air conditioner (excluding electrically driven compressor 170), or suchlike equipment installed in or on the vehicle.

In this embodiment, a regenerative system comprises a plurality of devices—for example, generator 110, first battery 120 that is the high-voltage main battery (a nickel-hydride battery or lithium-ion battery), step-down DC-DC converter 140, second battery 130 that is a general lead battery with a 12 V nominal voltage, and electrically driven compressor 170.

Also, in view of the fact that the larger an electrical load the more accurately battery deterioration can be detected, deterioration of first battery 120 is detected with a high degree of accuracy by outputting (discharging) higher electric power from first battery 120 by controlling a plurality of devices (for example, electrically driven compressor 170/electrical equipment 180 and DC-DC converter 140), and at the same time actively (forcibly) creating a situation in which an electrical load is applied. Specifically, first, a situation is actively created for enabling deterioration of first battery 120 to be detected with a high degree of accuracy. For example, when electrically driven compressor 170 is turned on or its power consumption increases, or when electrical equipment (general load) 180, such as headlights, is turned on, the output voltage of DC-DC converter 140 is increased with the timing synchronized with the power consumption of electrically driven compressor 170 or electrical equipment 180, provision is made for electric power also to be supplied to second battery 130, and electric power output from first battery 120 is increased. Then, at the instant at which the electric power output from first battery 120 increases, the current and voltage of first battery 120 are simultaneously measured, the internal resistance of first battery 120 is calculated from the measurement results, and the deterioration of first battery 120 is detected.

Here, the timing at which the output voltage of DC-DC converter 140 is increased should be aligned with the timing of power consumption of electrically driven compressor 170 or electrical equipment 180, and when a condition for which drawing of a current from first battery 120 is predicted is satisfied, the output voltage of DC-DC converter 140 is increased in synchronization with this. A condition for which drawing of a current from first battery 120 is predicted is set beforehand by means of experimentation or the like, for example. Examples of such conditions are as shown in FIG. 2, for example.

Figure 3:
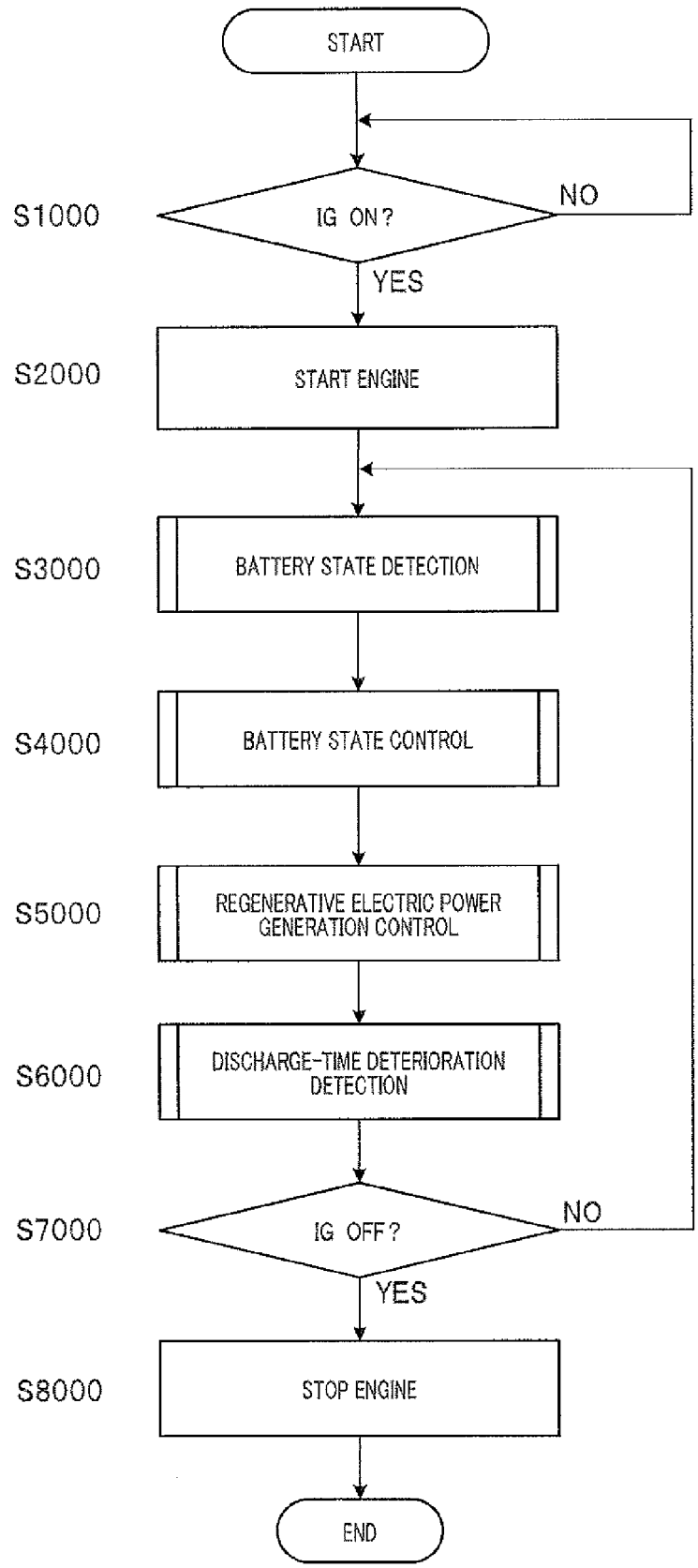
FIG. 3 is a main flowchart showing the overall operation of the power supply system in FIG. 1.
Figure 4:
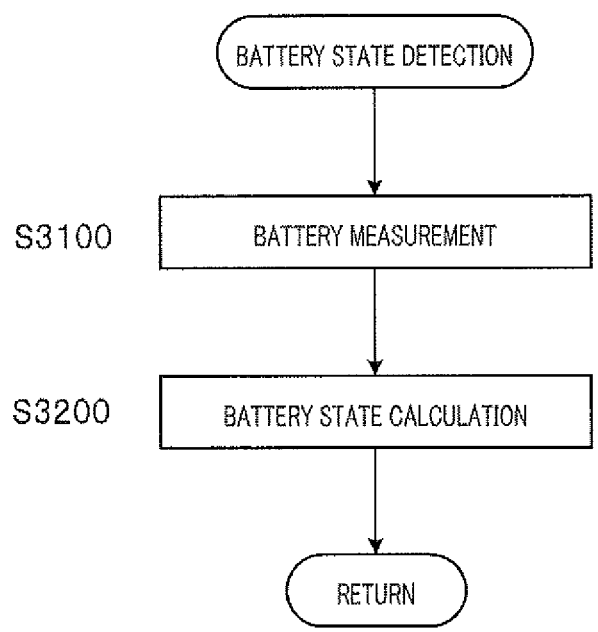
FIG. 4 is a flowchart showing the contents of the battery state detection processing in FIG. 3.
Figure 5:
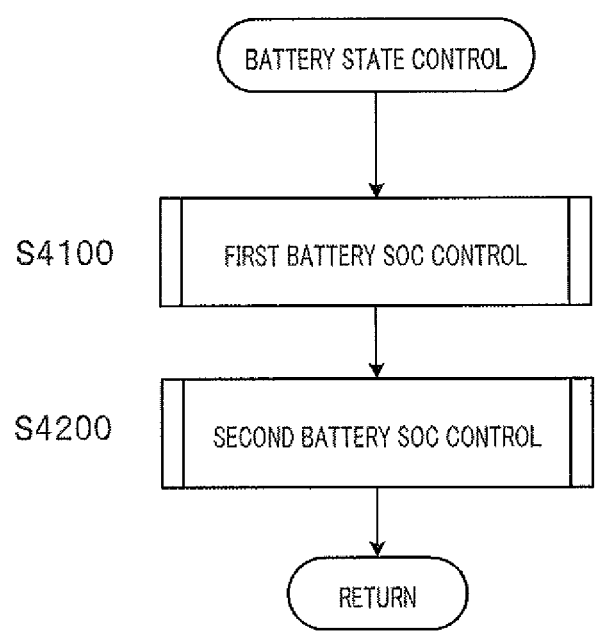
FIG. 5 is a flowchart showing the contents of the battery state control processing in FIG. 3.
Figure 6:
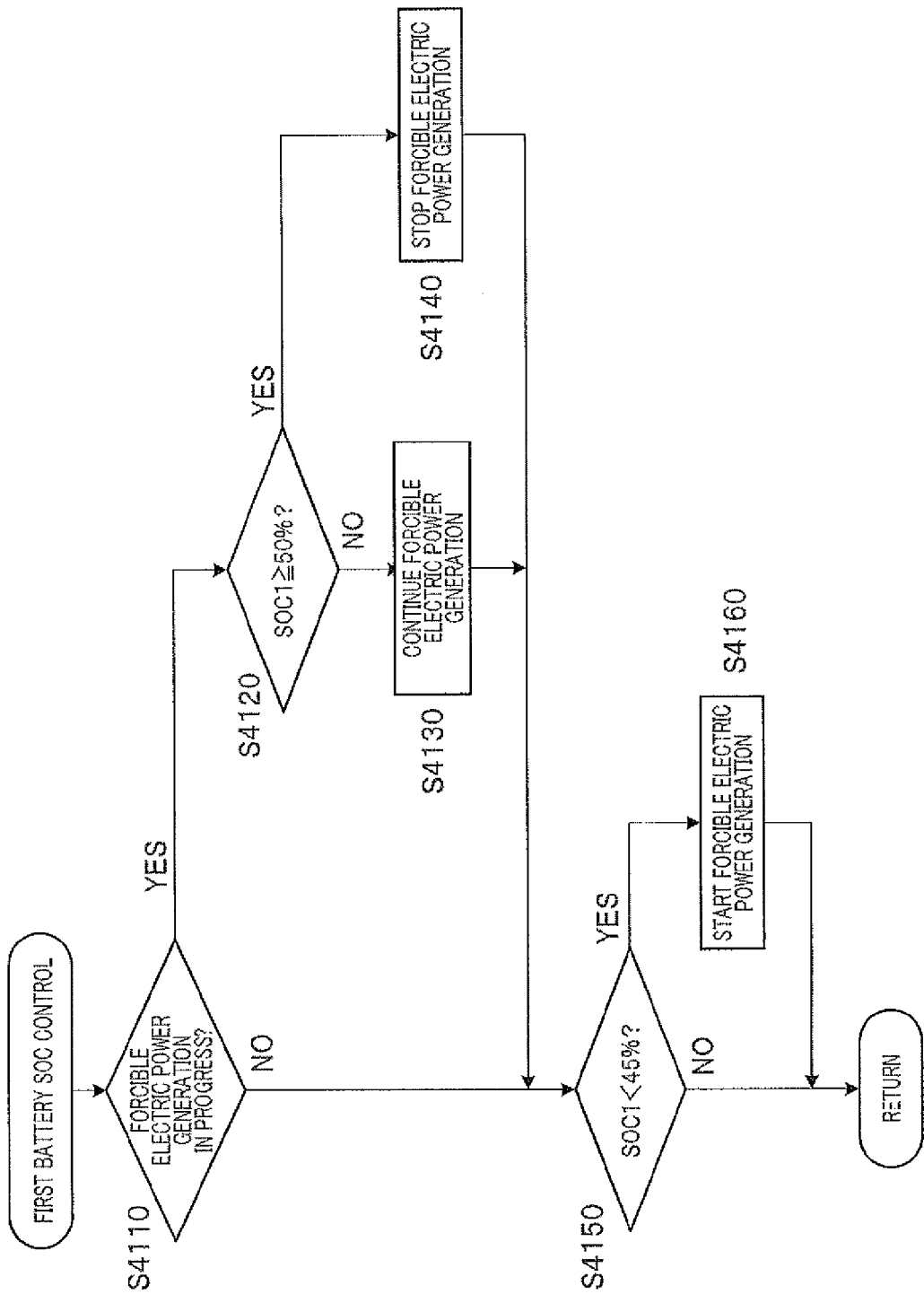
FIG. 6 is a flowchart showing the contents of the first battery SOC control processing in FIG. 5.
Figure 7:
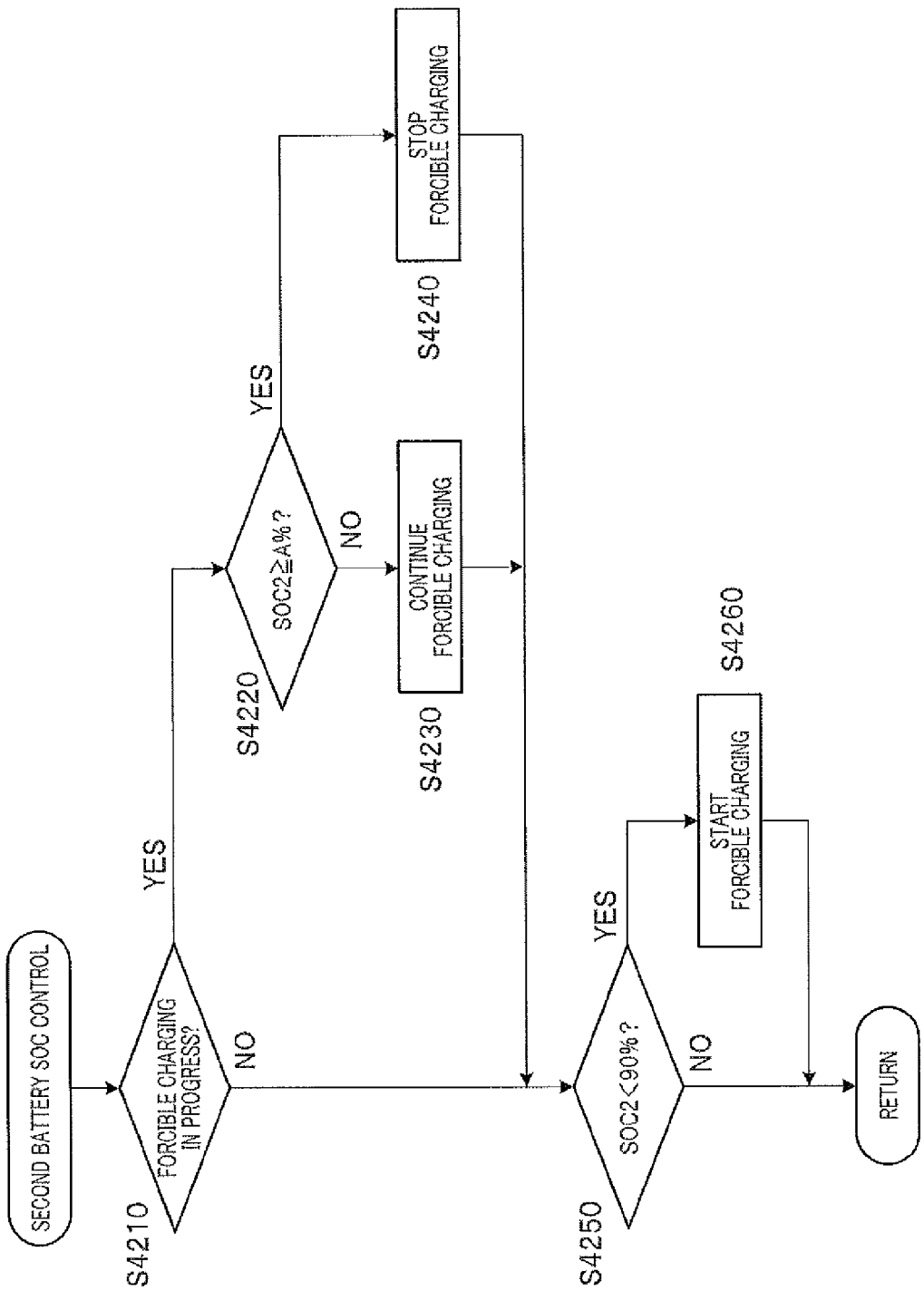
FIG. 7 is a flowchart showing the contents of the second battery SOC control processing in FIG. 5.
Figure 8:
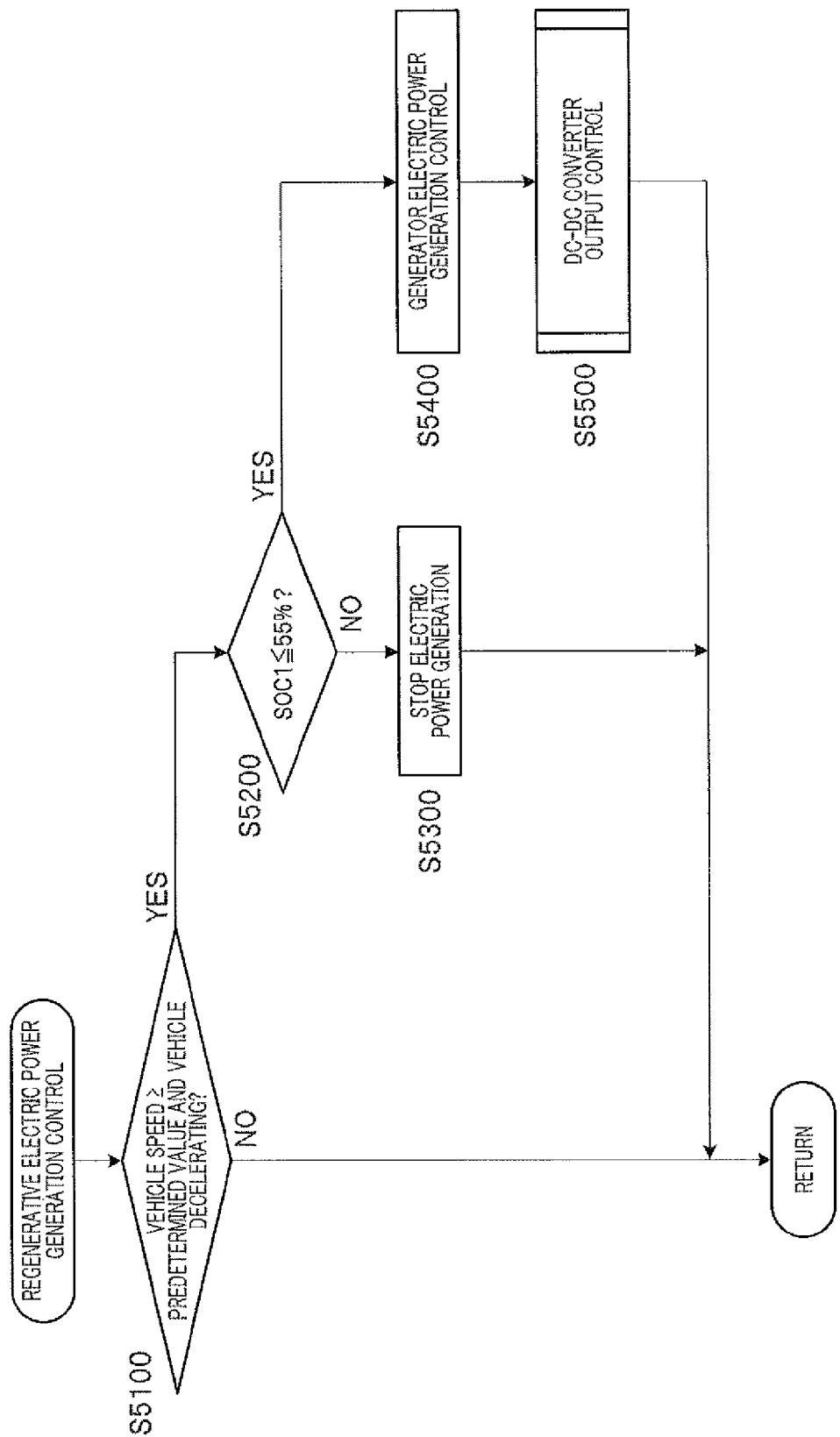
FIG. 8 is a flowchart showing the contents of the regenerative electric power generation control processing in FIG. 3.
Figure 9:
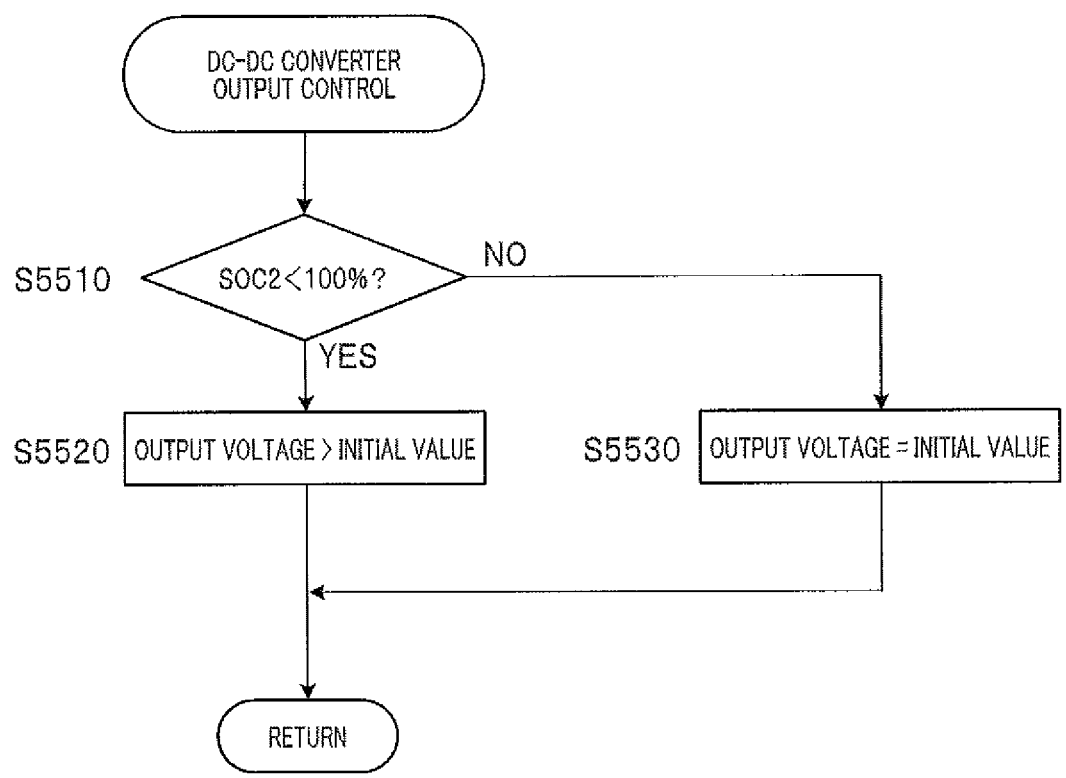
FIG. 9 is a flowchart showing the contents of the DC-DC converter output control processing in FIG. 5.
Figure 10:
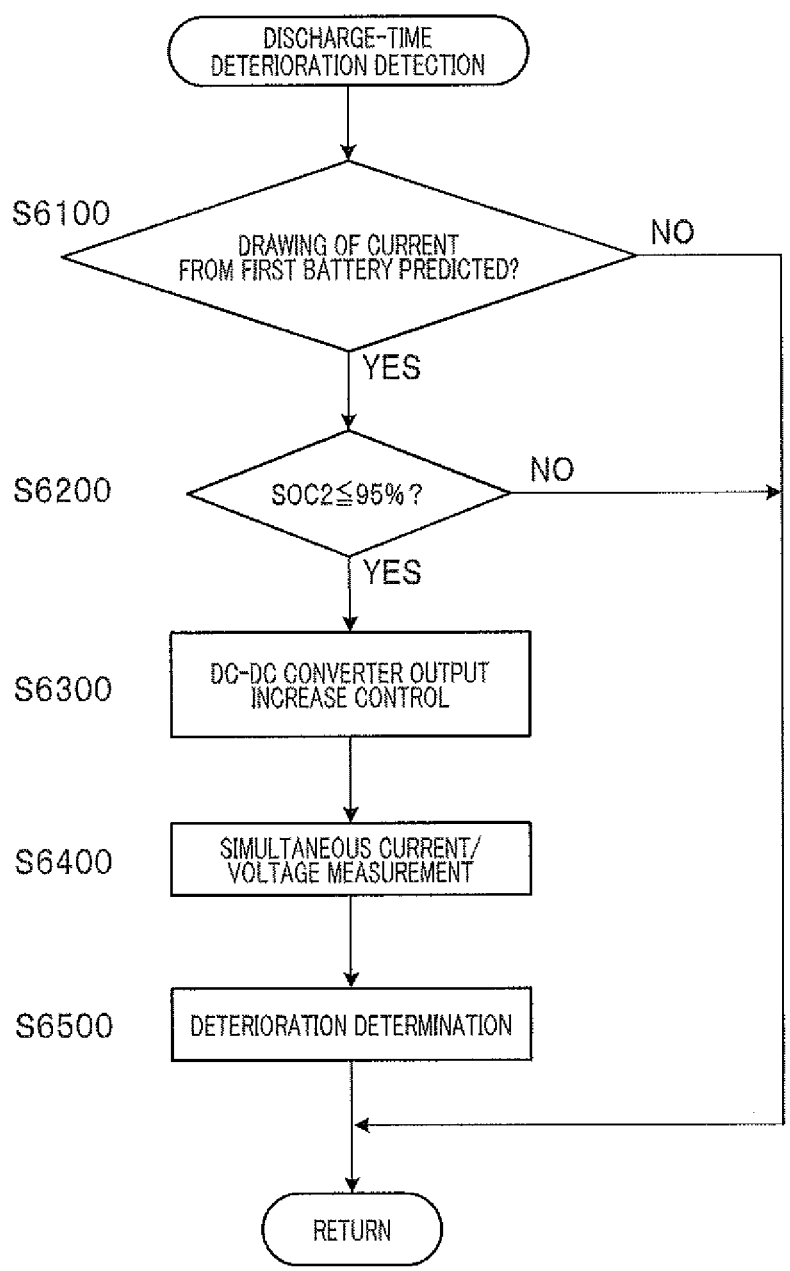
FIG. 10 is a flowchart showing the contents of the discharge-time deterioration detection processing in FIG. 3.

Next, the operation of power supply system 100 having the above configuration will be described using FIG. 3 through FIG. 11. Here, FIG. 3 is a main flowchart showing the overall operation of power supply system 100 in FIG. 1, FIG. 4 is a flowchart showing the contents of the battery state detection processing in FIG. 3, FIG. 5 is a flowchart showing the contents of the battery state control processing in FIG. 3, FIG. 6 is a flowchart showing the contents of the first battery SOC control processing in FIG. 5, FIG. 7 is a flowchart showing the contents of the second battery SOC control processing in FIG. 5, FIG. 8 is a flowchart showing the contents of the regenerative electric power generation control processing in FIG. 3, FIG. 9 is a flowchart showing the contents of the DC-DC converter output control processing in FIG. 8, FIG. 10 is a flowchart showing the contents of the discharge-time deterioration detection processing in FIG. 3, and FIG. 11 comprises schematic drawings for explaining the contents of the discharge-time deterioration detection processing in FIG. 3. The flowcharts in FIG. 3 through FIG. 10 are stored as control programs in a storage apparatus such as ROM, and are executed by a CPU.

First, in step S1000, power supply ECU 150 determines whether or not the ignition (IG) switch (not shown) has been switched on. Specifically, if the ignition switch has been turned to the engine start position (ST position), power supply ECU 150 determines that the ignition switch has been switched on. If it is determined that the ignition switch has been switched on (S1000: YES), the processing flow proceeds to step S2000, whereas if it is determined that the ignition switch has not been switched on (S1000: NO), the program goes to a standby state.

In step S2000, power supply ECU 150 starts the engine. Specifically, power supply ECU 150 turns on starter relay 162 and applies a current to starter 160 from second battery 130. By this means, the engine starts.

In step S3000, power supply ECU 150 performs battery state detection processing. The contents of this battery state detection processing are as shown in the flowchart in FIG. 4.

First, in step S3100, power supply ECU 150 performs battery measurement. Specifically, power supply ECU 150 measures the first battery 120 current ($I_1$) and voltage ($V_1$), and also measures the second battery 130 current ($I_2$) and voltage ($V_2$). The first battery 120 current ($I_1$) is detected by current sensor 122, and the second battery 130 current ($I_2$) is detected by current sensor 132.

Then, in step S3200, power supply ECU 150 performs battery state calculation. Specifically, for example, power supply ECU 150 performs current sensor 122 detection result (charge/discharge current value) integration and calculates the first battery 120 SOC (hereinafter referred to as "SOC1"), and performs current sensor 132 detection result (charge/ discharge current value) integration and calculates the second battery 130 SOC (hereinafter referred to as "SOC2"). In this way, battery SOC calculation can be performed by integrating current flowing into a battery and current flowing out of the battery (so-called Coulomb count processing). The SOC calculation method for batteries 120 and 130 is not limited to Coulomb count processing, and any other known method can also be used. Following this, the control procedure returns to the main flowchart in FIG. 3.

In step S4000, power supply ECU 150 performs battery state control processing. In this battery state control processing, since batteries 120 and 130 will deteriorate more quickly if states of charge SOC1 and SOC2 of batteries 120 and 130 fall excessively, states of charge SOC1 and SOC2 of batteries 120 and 130 are controlled so as not to become less than or equal to a predetermined value. The contents of this battery state control processing are as shown in the flowchart in FIG. 5.

First, in step S4100, power supply ECU 150 performs first battery SOC control processing. In this first battery SOC control processing, state of charge SOC1 of first battery 120 is controlled within a fixed range. Here, "a fixed range" is decided taking the characteristics of first battery 120 into consideration. For example, in the case of a lithium-ion battery, deterioration progresses more quickly if the SOC is too high or too low, and therefore a lithium-ion battery is normally used in a state in which the SOC is within an appropriate range (for example, 40 to 60%). In this embodiment, the upper limit and lower limit are each narrowed by 5%, and state of charge SOC1 of first battery 120 is controlled within a range of 45 to 55% (lower limit=45%, upper limit=55%). Also, for example, assuming a case in which first battery 120 is a lithium-ion battery, in order to leave a margin in charging by regenerated electric power, a forcible electric power generation on (started)/off (stopped) state of generator 110 is switched in a range in which state of charge SOC1 of first battery 120 is 45% or more and less than 50%. The contents of this first battery SOC control processing are as shown in the flowchart in FIG. 6.

First, in step S4110, power supply ECU 150 determines whether or not generator 110 is performing forcible electric power generation. If it is determined that generator 110 is performing forcible electric power generation (S4110: YES), the processing flow proceeds to step S4120, whereas if it is determined that generator 110 is not performing forcible electric power generation (S4110: NO), the processing flow proceeds to step S4150.

In step S4120, power supply ECU 150 further determines whether or not state of charge SOC1 of first battery 120 is greater than or equal to 50%. If it is determined that state of charge SOC1 of first battery 120 is less than 50% (S4120: NO), the processing flow proceeds to step S4130, whereas if it is determined that state of charge SOC1 of first battery 120 is greater than or equal to 50% (S4120: YES), the processing flow proceeds to step S4140.

In step S4130, since state of charge SOC1 of first battery 120 is less than 50%, power supply ECU 150 continues forcible electric power generation by generator 110. By this means, first battery 120 is charged with electric power forcibly generated by generator 110. Following this, the control procedure proceeds to step S4150.

On the other hand, in step S4140, since state of charge SOC1 of first battery 120 is greater than or equal to 50%, power supply ECU 150 stops forcible electric power generation by generator 110 to leave a margin in charging by regenerated electric power. By this means, charging of first battery 120 with electric power forcibly generated by generator 110 is stopped. Following this, the control procedure proceeds to step S4150.

In step S4150, power supply ECU 150 determines whether or not state of charge SOC1 of first battery 120 is less than 45%. If it is determined that state of charge SOC1 of first battery 120 is less than 45% (S4150: YES), the processing flow proceeds to step S4160, whereas if it is determined that state of charge SOC1 of first battery 120 is greater than or equal to 45% (S4150: NO), the control procedure immediately returns to the flowchart in FIG. 5.

In step S4160, since state of charge SOC1 of first battery 120 has fallen below 45%, power supply ECU 150 starts forcible electric power generation by generator 110. By this means, first battery 120 is charged with electric power forcibly generated by generator 110. Following this, the control procedure returns to the flowchart in FIG. 5.

Next, in step S4200, power supply ECU 150 performs second battery SOC control processing. In this second battery SOC control processing, state of charge SOC2 of second battery 130 is controlled within a fixed range. Here, "a fixed range" is decided taking the characteristics of second battery 130 into consideration. For example, in the case of a lead battery, deterioration progresses more quickly the greater the fall in the SOC from a fully-charged (100%) state, and therefore a lead battery is normally used in a state close to a fully-charged state (SOC=100%). In this embodiment, for example, assuming a case in which second battery 130 is a lead battery, in order to leave a margin in charging by regenerated electric power, an on (started)/off (stopped) state of forcible charging from first battery 120 to second battery 130 is switched in a range in which state of charge SOC2 of second battery 130 is 90% or more and less than A % (normally 95%). This forcible charging on (started)/off (stopped) state is switched by controlling the output voltage of DC-DC converter 140. The contents of this second battery SOC control processing are as shown in the flowchart in FIG. 7.

First, in step S4210, power supply ECU 150 determines whether or not second battery 130 is being forcibly charged. If it is determined that second battery 130 is being forcibly charged (S4210: YES), the processing flow proceeds to step S4220, whereas if it is determined that second battery 130 is not being forcibly charged (S4210: NO), the processing flow proceeds to step S4250.

In step S4220, power supply ECU 150 further determines whether or not state of charge SOC2 of second battery 130 is greater than or equal to predetermined value A %. Here, "predetermined value A" is normally set to 95 (%), for example. However, when drawing of a current from first battery 120 is predicted (see FIG. 2), for example, predetermined value A is set to 92 (%), and state of charge SOC2 of second battery 130 is consistently lowered somewhat. By this means, second battery 130 is placed in a state in which it is readily charged at any time (that is, in which the charging current is large), and a discharge current from first battery 120 at the time of deterioration detection of first battery 120 can be made larger. If it is determined that state of charge SOC2 of second battery 130 is less than A % (S4220: NO), the processing flow proceeds to step S4230, whereas if it is determined that state of charge SOC2 of second battery 130 is greater than or equal to A % (S4220: YES), the processing flow proceeds to step S4240.

In step S4230, since state of charge SOC2 of second battery 130 is less than A %, power supply ECU 150 continues forcible charging from first battery 120 to second battery 130. That is to say, power supply ECU 150 keeps the output voltage of DC-DC converter 140 at 14.5 V. By this means, charging from first battery 120 to second battery 130 is forcibly performed. Following this, the control procedure proceeds to step S4250.

On the other hand, in step S4240, since state of charge SOC2 of second battery 130 is greater than or equal to A %, power supply ECU 150 stops forcible charging of second battery 130 from first battery 120 to leave a margin in charging by regenerated electric power. That is to say, power supply ECU 150 returns the output voltage of DC-DC converter 140 to 12.5 V. By this means, charging of second battery 130 from first battery 120 is stopped. Following this, the control procedure proceeds to step S4250.

In step S4250, power supply ECU 150 determines whether or not state of charge SOC2 of second battery 130 is less than 90%. If it is determined that state of charge SOC2 of second battery 130 is less than 90% (S4250: YES), the processing flow proceeds to step S4260, whereas if it is determined that state of charge SOC2 of second battery 130 is greater than or equal to 90% (S4250: NO), the control procedure immediately returns to the main flowchart in FIG. 3.

In step S4260, since state of charge SOC2 of second battery 130 has fallen below 90%, power supply ECU 150 starts forcible charging of second battery 130 from first battery 120. That is to say, power supply ECU 150 raises the output voltage of DC-DC converter 140 to 14.5 V. By this means, electric power is supplied to second battery 130 from first battery 120, and second battery 130 is forcibly charged with this electric power. Following this, the control procedure returns to the main flowchart in FIG. 3.

In step S5000, power supply ECU 150 performs regenerative electric power generation control. The contents of this regenerative electric power generation control are as shown in the flowchart in FIG. 8.

First, in step S5100, power supply ECU 150 determines whether or not the vehicle speed is greater than or equal to a predetermined value (for example, 10 km/h) and the vehicle is decelerating. Here, determining whether or not the vehicle speed is greater than or equal to a predetermined value is to determine whether or not the current vehicle speed is suitable for regenerative electric power generation—that is, whether or not kinetic energy necessary for regenerative electric power generation is available in the vehicle. Regenerated energy is obtained by converting kinetic energy of the vehicle to electrical energy, and if the vehicle speed is low, the kinetic energy is low. Thus, a regenerated energy amount cannot be expected. Whether or not the vehicle is decelerating is determined, for example, based on vehicle speed information, or based on the degree of brake pedal depression (whether the brake pedal is being depressed). If it is determined that the vehicle speed is greater than or equal to the predetermined value (10 km/h) and the vehicle is decelerating (S5100: YES), the processing flow proceeds to step S5200, and if this is not the case—that is, if the vehicle speed is less than the predetermined value (10 km/h) or the vehicle is not decelerating (that is, the vehicle is accelerating, traveling at a constant speed, idling, or the like)—(S5100: NO), the control procedure immediately returns to the main flowchart in FIG. 3.

In step S5200, power supply ECU 150 determines whether or not state of charge (SOC1) of first battery 120 is less than or equal to a predetermined value (for example, 55%). This predetermined value (55%) is the above upper limit. If it is determined that state of charge (SOC1) of first battery 120 exceeds the predetermined value (55%) (S5200: NO), the processing flow proceeds to step S5300, whereas if it is determined that state of charge (SOC1) of first battery 120 is less than or equal to the predetermined value (55%) (S5200: YES), the processing flow proceeds to step S5400.

In step S5300, power supply ECU 150 stops electric power generation by generator 110. Following this, the control procedure returns to the main flowchart in FIG. 3.

On the other hand, in step S5400, power supply ECU 150 performs electric power generation control on generator 110. Specifically, power supply ECU 150 sets and outputs an output instruction value to generator 110 to a target value. Here, a "target value" is a voltage necessary to charge first battery 120, and in the case of a 36 V lithium-ion battery, for example, this target value is 42 V.

Then in step S5500, power supply ECU 150 performs output control on DC-DC converter 140. The contents of this output control are as shown in the flowchart in FIG. 9.

First, in step S5510, power supply ECU 150 determines whether or not state of charge SOC2 of second battery 130 is less than 100%. If it is determined that state of charge SOC2 of second battery 130 is less than 100% (S5510: YES), the processing flow proceeds to step S5520, whereas if it is determined that state of charge SOC2 of second battery 130 is greater than or equal to 100% (S5510: NO), the processing flow proceeds to step S5530.

In step S5520, since second battery 130 is not in a fully-charged (SOC2=100%) state, power supply ECU 150 raises the output voltage of DC-DC converter 140 to 14.5 V, higher than the initial value (12.5 V). By this means, regenerated electric power generated by generator 110 charges not only first battery 120 but also second battery 130. Following this, the control procedure returns to the main flowchart in FIG. 3.

On the other hand, in step S5530, since second battery 130 is in a fully-charged (SOC2=100%) state, power supply ECU 150 returns the output voltage of DC-DC converter 140 to the initial value (12.5 V). The reason for this is that a lead battery will deteriorate more quickly if excessively charged. Following this, the control procedure returns to the main flowchart in FIG. 3.

Next, in step S6000, power supply ECU 150 performs discharge-time deterioration detection processing. This discharge-time deterioration detection processing is as shown in the flowchart in FIG. 10.

First, in step S6100, power supply ECU 150 determines whether or not drawing of a current from first battery 120 is predicted. This determination is made, for example, by determining whether or not a predetermined condition shown in FIG. 2 is satisfied. For example, in the example shown in FIG. 2, with regard to electrically driven compressor 170, if the temperature inside the vehicle rises by a certain temperature (for example, 5° C.) or more in a certain time (for example, one minute), it is predicted that the user will turn on the air conditioner (if the air conditioner is off) or increase the output of the air conditioner (if the air conditioner is on), and drawing of a current from first battery 120 occurs through the air conditioner actually being turned on or the air conditioner output actually being increased subsequently. Apart from electrically driven compressor 170, drawing of a current from first battery 120 is also predicted if a condition such as shown in FIG. 2 is satisfied for electrical equipment 180 with comparatively high power consumption (such as headlights, power steering, brake lights, or windshield wipers, for example). If it is determined that drawing of a current from first battery 120 is predicted (S6100: YES), the processing flow proceeds to step S6200, whereas if it is determined that drawing of a current from first battery 120 is not predicted (S6100: NO), the control procedure immediately returns to the main flowchart in FIG. 3.

In step S6200, power supply ECU 150 further determines whether or not state of charge SOC2 of second battery 130 is less than or equal to 95%. The reason for this is to determine whether or not second battery 130 (a lead battery) is in a state in which it readily absorbs electric power (that is, readily receives a supply of electric power). If it is determined that state of charge SOC2 of second battery 130 is less than or equal to 95% (S6200: YES), the processing flow proceeds to step S6300, whereas if it is determined that state of charge SOC2 of second battery 130 exceeds 95% (S6200: NO), the control procedure immediately returns to the main flowchart in FIG. 3.

In step S6300, power supply ECU 150 performs output increase control of DC-DC converter 140. Specifically, power supply ECU 150 raises (increases) the output voltage of DC-DC converter 140 from the initial value (12.5 V) to 14.5 V. By this means, electric power is supplied from first battery 120 not only to electrically driven compressor 170 or electrical equipment 180, but also to second battery 130, and supplying power to second battery 130 is started in line with (that is, in synchronization with) the timing of the start of power consumption by electrically driven compressor 170 or electrical equipment 180. Thus, a situation in which greater electric power is output (discharged) from first battery 120 is forcibly (actively) created. For example, as shown schematically in FIG. 11 (A), greater electric power (a larger current) is output when the output voltage of DC-DC converter 140 is increased in addition to driving of electrically driven compressor 170 than when only electrically driven compressor 170 is driven.

Then, in step S6400, power supply ECU 150 performs simultaneous current and voltage measurement for first battery 120. At this time, as shown schematically in FIG. 11(A), for example, power supply ECU 150 can simultaneously measure the current and voltage of first battery 120 at the instant at which electric power output from first battery 120 increases. The measurement of current and voltage is performed for at least two points.

Figure 11:
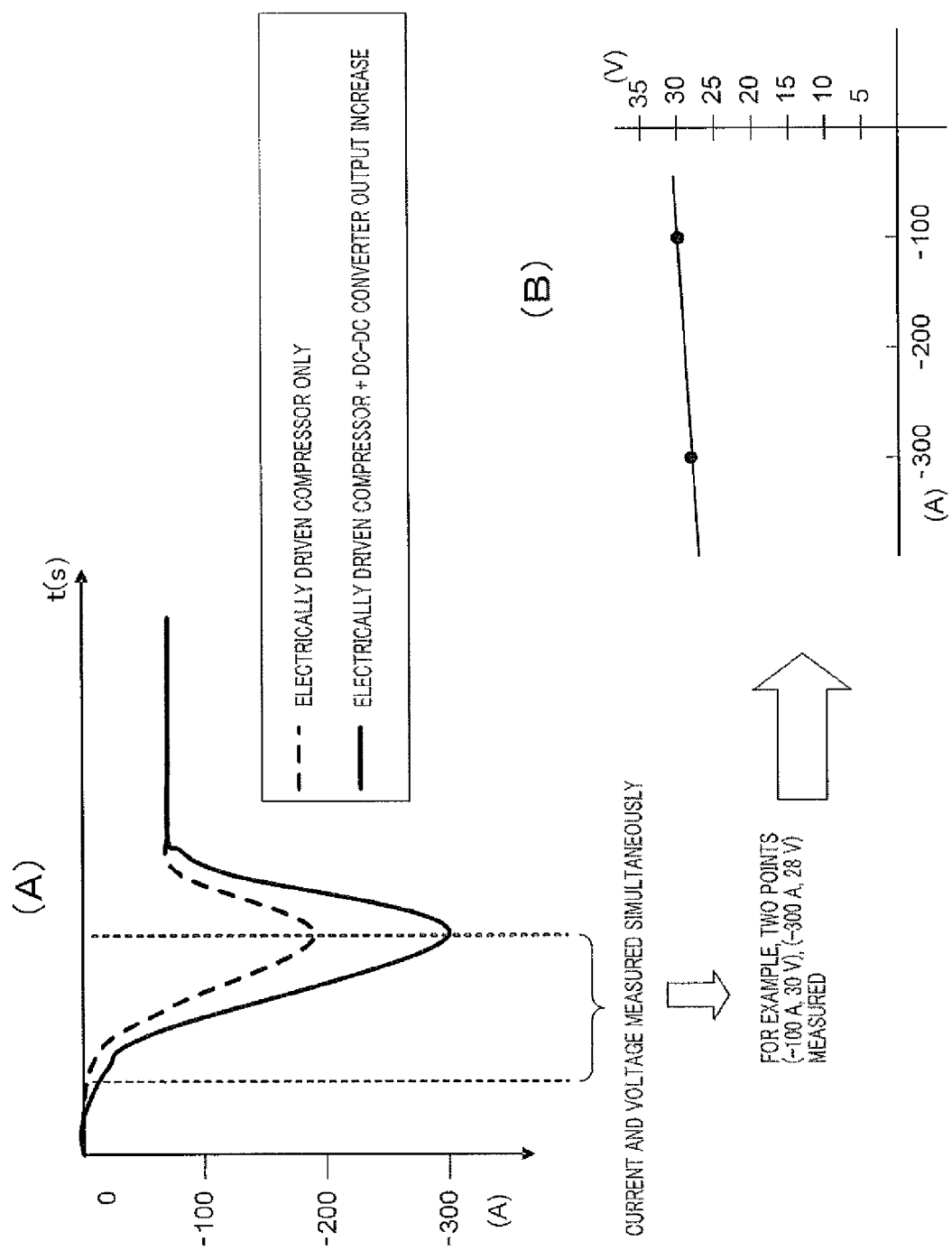
FIG. 11 comprises schematic drawings for explaining the contents of the discharge-time deterioration detection processing in FIG. 3.

In step S6500, power supply ECU 150 performs deterioration determination. Specifically, power supply ECU 150 calculates internal resistance r by means of equation 1 below, using the currents and voltages of a plurality of points measured in step S6400. Internal resistance r is one indicator of battery deterioration. For example, as shown schematically in FIG. 11(B), if current and voltage are taken as coordinate axes and measured currents and voltages of a plurality of points are plotted on the coordinate plane, the gradient of a linear approximation is internal resistance r. Solving equation 1 using measured values (−100 A, 30 V) and (−300 A, 28 V) of two points shown in FIG. 11 gives a value of 0.01Ω for internal resistance r. While solving equation 1 for internal resistance r requires measurements for at least two points, measurements for three or more points may be used in order to improve the accuracy of deterioration determination.

$$E + rI = V \qquad \text{(Equation 1)}$$

where E: Electromotive force
r: Internal resistance
I: Current
V: Voltage

Power supply ECU 150 compares calculated internal resistance r with a predetermined determination value, and determines whether or not there is deterioration of first battery 120. The determination result is stored in a storage apparatus such as RAM, and is also reported to the user. Following this, the control procedure returns to the main flowchart in FIG. 3.

Next, in step S7000, power supply ECU 150 determines whether or not the ignition (IG) switch has been switched off. If it is determined that the ignition switch has been switched off (S7000: YES), the processing flow proceeds to step S8000, whereas if it is determined that the ignition switch has not been switched off (S7000: NO), the processing flow returns to step S3000.

In step S7000, power supply ECU 150 stops the engine, Specifically, power supply ECU 150 outputs a control signal that stops the engine to an engine ECU (not shown) that controls engine operation. By this means, the engine stops.

Thus, according to this embodiment, greater electric power can be output (discharged) from first battery 120 by controlling a plurality of devices (for example, electrically driven compressor 170/electrical equipment 180 and DC-DC converter 140) and actively (forcibly) creating a situation in which an electrical load is applied simultaneously.

Consequently, deterioration of first battery 120 can be detected with a high degree of accuracy.

Embodiment 2

In Embodiment 2 of the present invention, battery deterioration detection at the time of charging will be described, The configuration of a power supply system of this embodiment is identical to the configuration of a power supply system that includes the vehicle power supply apparatus according to Embodiment 1 shown in FIG. 1, In this embodiment, battery state control, regenerative electric power generation control, and battery deterioration detection by power supply ECU 150 differ from those in Embodiment 1.

Figure 13:
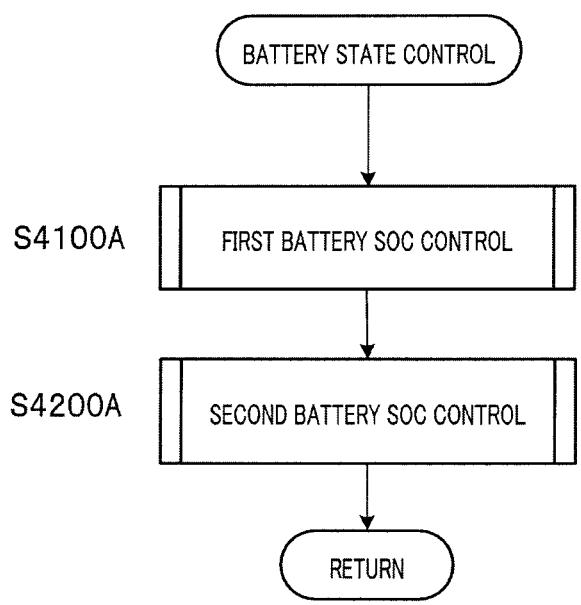
FIG. 13 is a flowchart showing the contents of the battery state control processing in FIG. 12.
Figure 14:
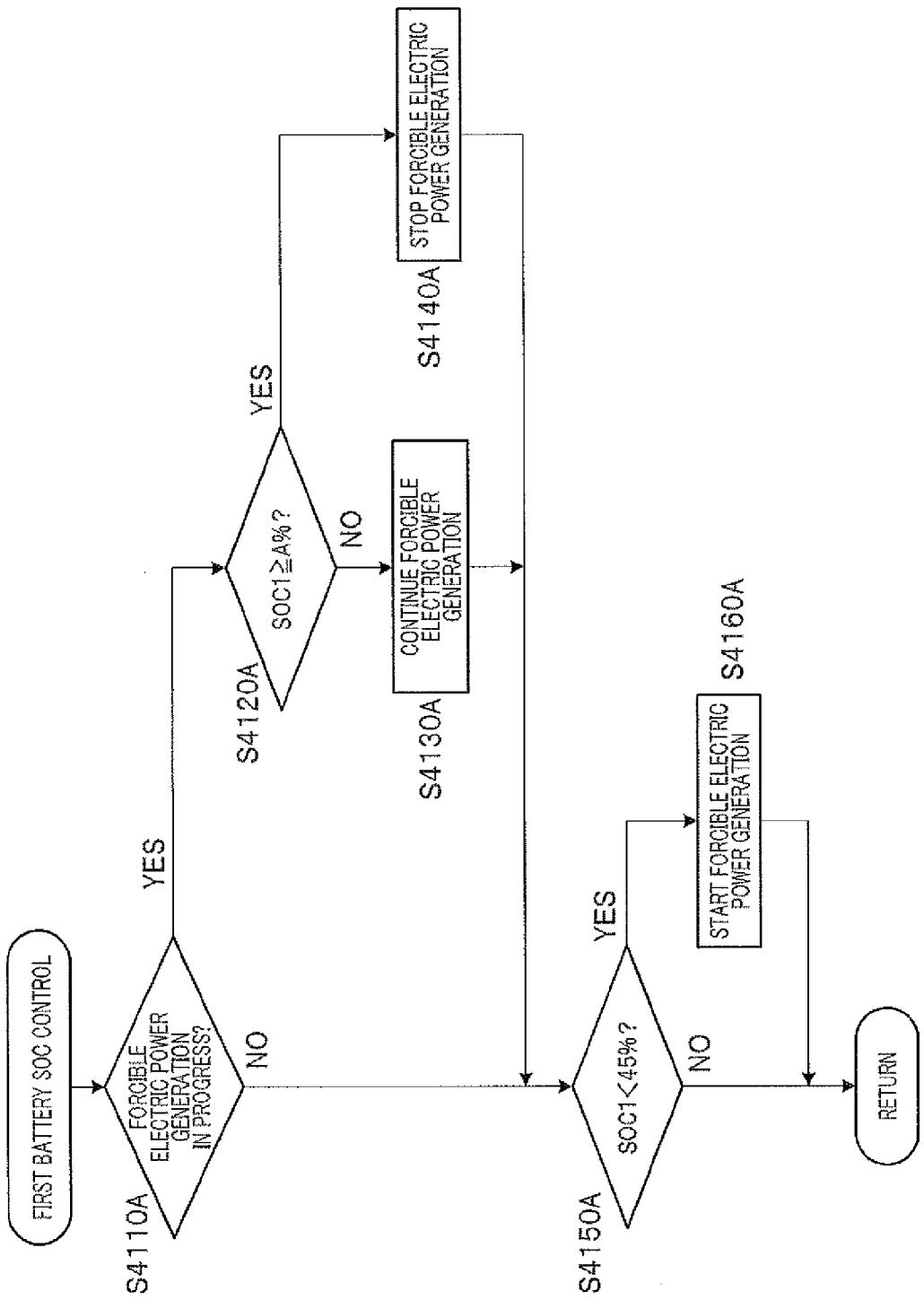
FIG. 14 is a flowchart showing the contents of the first battery SOC control processing in FIG. 13.
Figure 15:
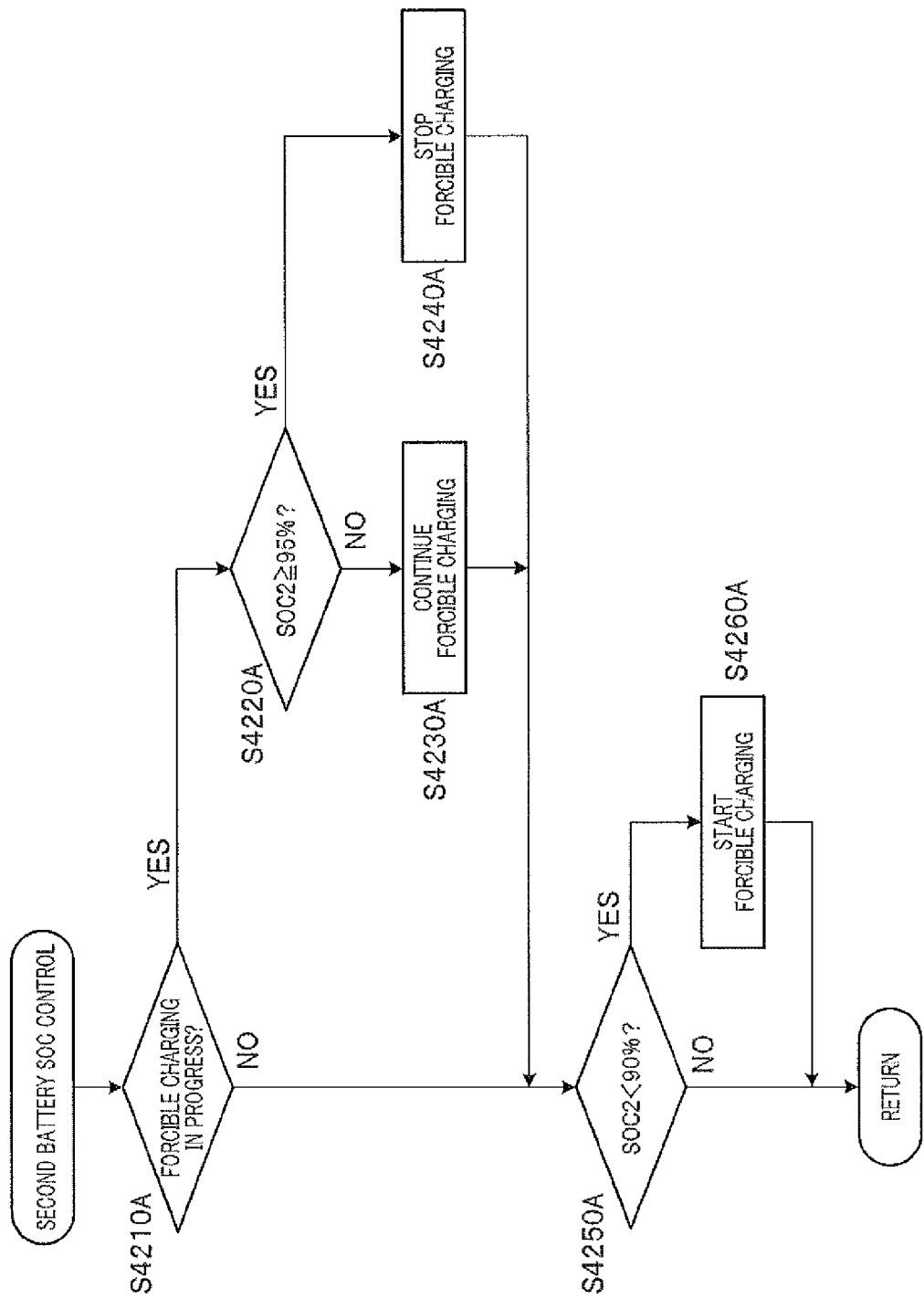
FIG. 15 is a flowchart showing the contents of the second battery SOC control processing in FIG. 13.
Figure 16:
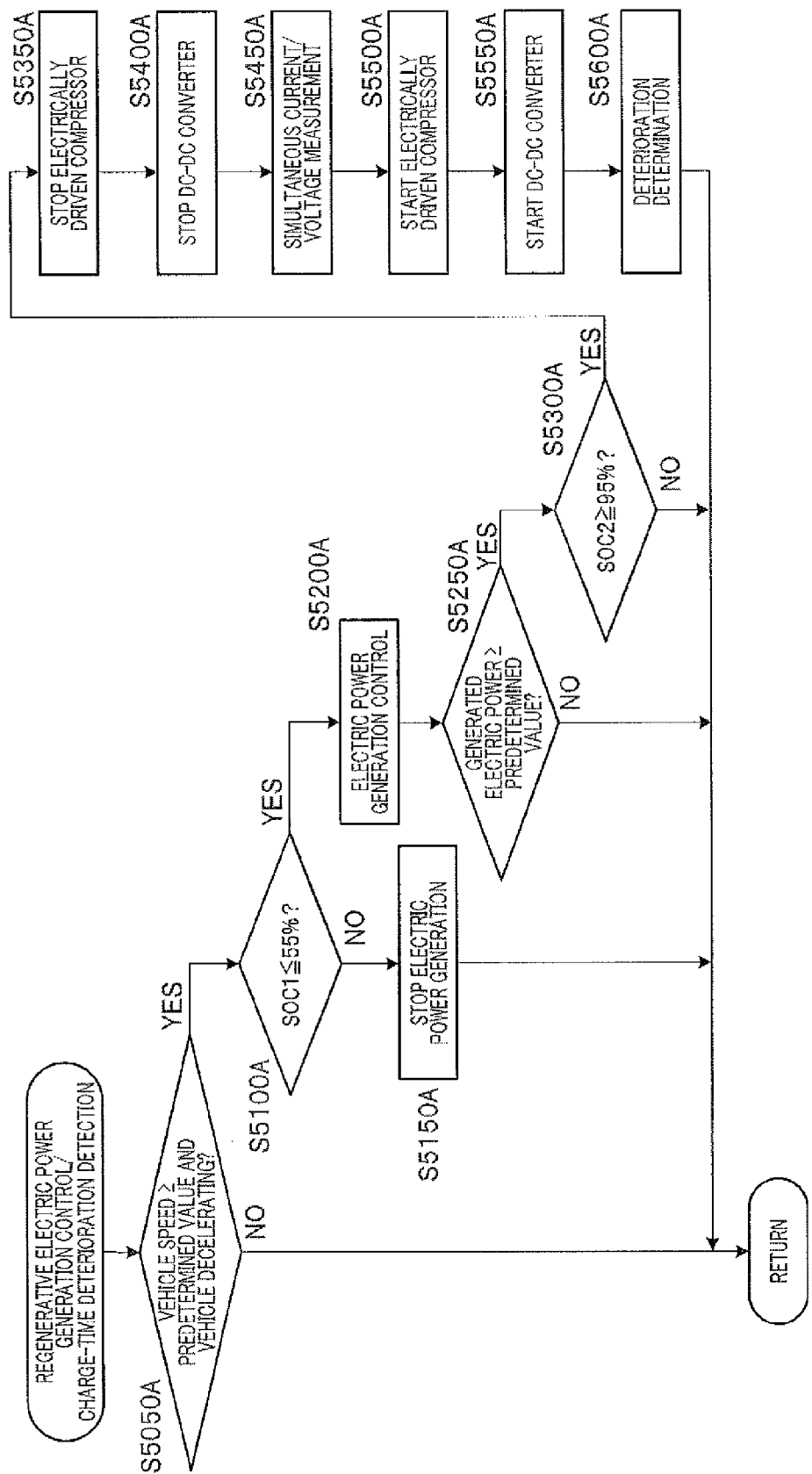
FIG. 16 is a flowchart showing the contents of the regenerative electric power generation control and charge-time deterioration detection processing in FIG. 12.

The operation of power supply system 100 having the above configuration will now be described using FIG. 12 through FIG. 17. Here, FIG. 12 is a main flowchart showing the overall operation of the power supply system in FIG. 1, FIG. 1 3 is a flowchart showing the contents of the battery state control processing in FIG. 12, FIG. 14 is a flowchart showing the contents of the first battery SOC control processing in FIG. 13, FIG. 15 is a flowchart showing the contents of the second battery SOC control processing in FIG. 13, FIG. 16 is a flowchart showing the contents of the regenerative electric power generation control and charge-time deterioration detection processing in FIG. 12, and FIG. 17 comprises schematic drawings for explaining the contents of the charge-time deterioration detection processing in FIG. 16.

Figure 12:
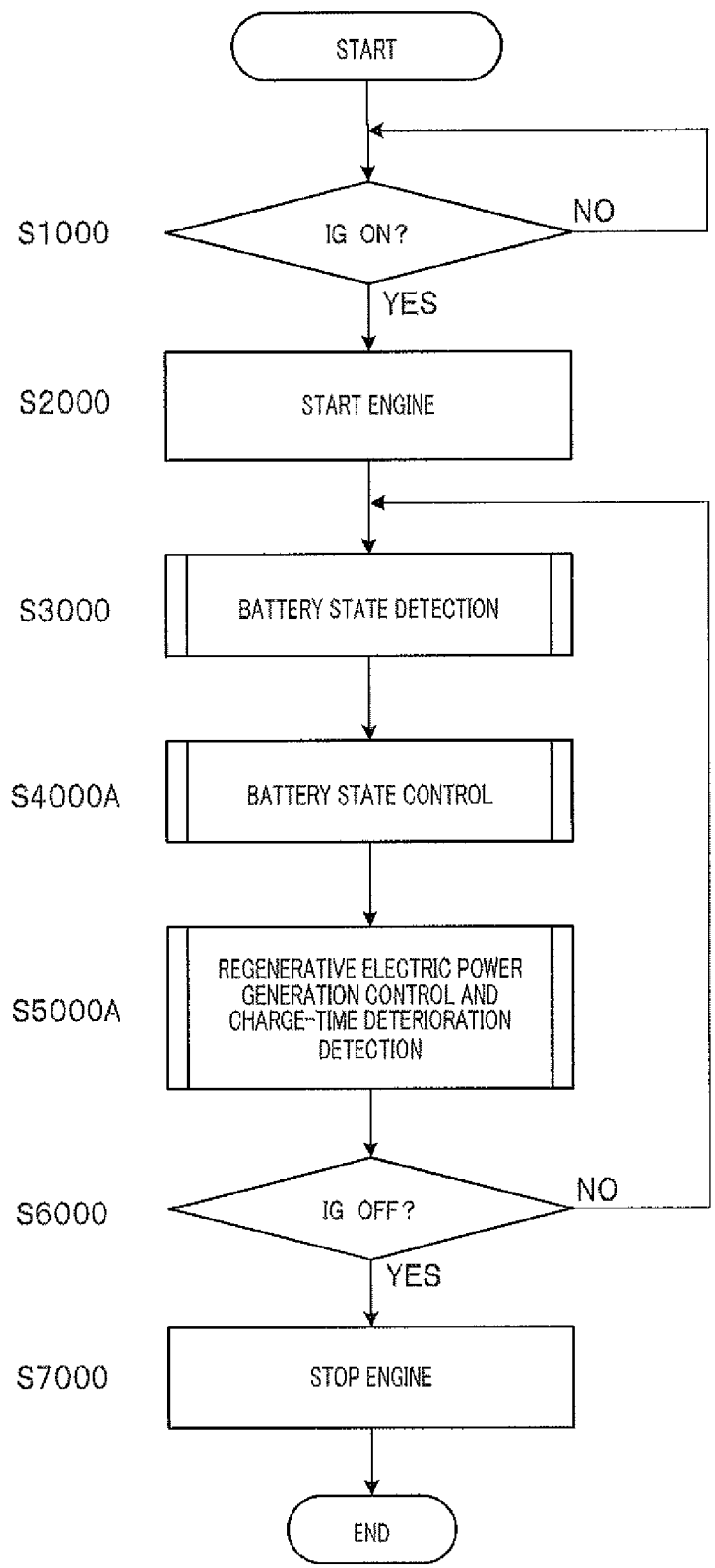
FIG. 12 is a main flowchart showing the overall operation of a power supply system according to Embodiment 2 of the present invention.

Steps in FIG. 12 common to FIG. 2 are assigned the same reference signs as in FIG. 2, and detailed descriptions thereof are omitted here. The operations in S1000, S2000, S3000, S6000, and S7000 in FIG. 12 are common to FIG. 2.

In step S4000A, power supply ECU 150 performs battery state control processing. In this battery state control processing, since batteries 120 and 130 will deteriorate more quickly if states of charge SOC1 and SOC2 of batteries 120 and 130 fall excessively, states of charge SOC1 and SOC2 of batteries 120 and 130 are controlled so as not to become less than or equal to a predetermined value. The contents of this battery state control processing are as shown in the flowchart in FIG. 13.

First, in step S4100A, power supply ECU 150 performs first battery SOC control processing. In this first battery SOC control processing, state of charge SOC1 of first battery 120 is controlled within a fixed range. Here, "a fixed range" is decided taking the characteristics of first battery 120 into consideration. For example, in the case of a lithium-ion battery, deterioration progresses more quickly if the SOC is too high or too low, and hence a lithium-ion battery is normally used in a state in which the SOC is within an appropriate range (for example, 40 to 60%). In this embodiment, the upper limit and lower limit are each narrowed by 5%, and state of charge SOC1 of first battery 120 is controlled within a range of 45 to 55% (lower limit=45%, upper limit=55%).

Also, for example, assuming a case in which first battery 120 is a lithium-ion battery, in order to leave a margin in charging by regenerated electric power, on (started)/off (stopped) state of a forcible electric power generation of generator 110 is switched in a range in which state of charge SOC1 of first battery 120 is 45% or more and less than A % (normally 50%, for example). The contents of this first battery SOC control processing are as shown in the flowchart in FIG. 14.

First, in step S4110A, power supply ECU 150 determines whether or not generator 110 is performing forcible electric power generation. If it is determined that generator 110 is performing forcible electric power generation (S4110A: YES), the processing flow proceeds to step S4120A, whereas if it is determined that generator 110 is not performing forcible electric power generation (S4110A: NO), the processing flow proceeds to step S4150A.

In step S4120A, power supply ECU 150 further determines whether or not state of charge SOC1 of first battery 120 is greater than or equal to A %. Here, "predetermined value A" is normally set to 50 (%), for example. However, since regenerated energy increases in proportion to an increase in vehicle speed, provision is made for the value of predetermined value A to be lowered in preparation for regenerated energy at the time of the next vehicle deceleration. For example, settings such as 50% for a vehicle speed of 60 km/h or less, 49% for a vehicle speed of 80 km/h or less, 48% for a vehicle speed of 100 km/h or less, and so forth, may be made. If it is determined that state of charge SOC1 of first battery 120 is less than A % (S4120A: NO), the processing flow proceeds to step S4130A, whereas if it is determined that state of charge SOC1 of first battery 120 is greater than or equal to A % (S4120A: YES), the processing flow proceeds to step S4140A.

In step S4130A, since state of charge SOC1 of first battery 120 is less than A %, power supply ECU 150 continues forcible electric power generation by generator 110. By this means, first battery 120 is charged with electric power forcibly generated by generator 110. Following this, the control procedure proceeds to step S4150A.

On the other hand, in step S4140A, since state of charge SOC1 of first battery 120 is greater than or equal to A %, power supply ECU 150 stops forcible electric power generation by generator 110 to leave a margin in charging by regenerated electric power. By this means, charging of first battery 120 with electric power forcibly generated by generator 110 is stopped. Following this, the control procedure proceeds to step S4150A.

In step S4150A, power supply ECU 150 determines whether or not state of charge SOC1 of first battery 120 is less than 45%. If it is determined that state of charge SOC1 of first battery 120 is less than 45% (S4150A: YES), the processing flow proceeds to step S4160A, whereas if it is determined that state of charge SOC1 of first battery 120 is greater than or equal to 45% (S4150A: NO), the control procedure immediately returns to the flowchart in FIG. 13.

In step S4160A, since state of charge SOC1 of first battery 120 has fallen below 45%, power supply ECU 150 starts forcible electric power generation by generator 110. By this means, first battery 120 is charged with electric power forcibly generated by generator 110. Following this, the control procedure returns to the flowchart in FIG. 13.

Next, in step S4200A, power supply ECU 150 performs second battery SOC control processing. In this second battery SOC control processing, state of charge SOC2 of second battery 130 is controlled within a fixed range. Here, "a fixed range" is decided taking the characteristics of second battery 130 into consideration. For example, in the case of a lead battery, the greater the fall in the SOC from a fully-charged (100%) state, the more quickly deterioration progresses, and therefore a lead battery is normally used in a state close to a fully-charged state (SOC=100%). In this embodiment, for example, assuming a case in which second battery 130 is a lead battery, in order to leave a margin in charging by regenerated electric power, an on (started)/off (stopped) state of forcible charging from first battery 120 to second battery 130 is switched in a range in which state of charge SOC2 of second battery 130 is 90% or more and less than 95%. This forcible charging on (started)/off (stopped) state is switched by controlling the output voltage of DC-DC converter 140. The contents of this second battery SOC control processing are as shown in the flowchart in FIG. 15, First, in step S4210A, power supply ECU 150 determines whether or not second battery 130 is being forcibly charged. If it is determined that second battery 130 is being forcibly charged (S4210A: YES), the processing flow proceeds to step S4220A, whereas if it is determined that second battery 130 is not being forcibly charged (S4210A: NO), the processing flow proceeds to step S4250A.

In step S4220A, power supply ECU 150 further determines whether or not state of charge SOC2 of second battery 130 is greater than or equal to 95%, If it is determined that state of charge SOC2 of second battery 130 is less than 95% (S4220A: NO), the processing flow proceeds to step S4230A, whereas if it is determined that state of charge SOC2 of second battery 130 is greater than or equal to 95% (S4220A: YES), the processing flow proceeds to step S4240A.

In step S4230A, since state of charge SOC2 of second battery 130 is less than 95%, power supply ECU 150 continues forcible charging from first battery 120 to second battery 130. That is to say, power supply ECU 150 keeps the output voltage of DC-DC converter 140 at 14.5 V. By this means, charging from first battery 120 to second battery 130 is forcibly performed. Following this, the control procedure proceeds to step S4250A.

On the other hand, in step S4240A, since state of charge SOC2 of second battery 130 is greater than or equal to 95%, power supply ECU 150 stops forcible charging of second battery 130 from first battery 120 to leave a margin in charging by regenerated electric power. That is to say, power supply ECU 150 returns the output voltage of DC-DC converter 140 to 12.5 V. By this means, charging of second battery 130 from first battery 120 is stopped. Following this, the control procedure proceeds to step S4250A.

In step S4250A, power supply ECU 150 determines whether or not state of charge SOC2 of second battery 130 is less than 90%. If it is determined that state of charge SOC2 of second battery 130 is less than 90% (S4250A: YES), the processing flow proceeds to step S4260A, whereas if it is determined that state of charge SOC2 of second battery 130 is greater than or equal to 90% (S4250A: NO), the control procedure immediately returns to the main flowchart in FIG. 12.

In step S4260A, since state of charge SOC2 of second battery 130 has fallen below 90%, power supply ECU 150 starts forcible charging of second battery 130 from first battery 120. That is to say, power supply ECU 150 raises the output voltage of DC-DC converter 140 to 14.5 V. By this means, electric power is supplied to second battery 130 from first battery 120, and second battery 130 is forcibly charged with this electric power. Following this, the control procedure returns to the main flowchart in FIG. 12.

In step S5000A, power supply ECU 150 performs regenerative electric power generation control and charge-time deterioration detection. The contents of this regenerative electric power generation control and charge-time deterioration detection are as shown in the flowchart in FIG. 16.

First, in step S5050A, power supply ECU 150 determines whether or not the vehicle speed is greater than or equal to a predetermined value (for example, 10 km/h) and the vehicle is decelerating. Here, determining whether or not the vehicle speed is greater than or equal to a predetermined value is to determine whether or not the current vehicle speed is suitable for regenerative electric power generation that is, whether or not kinetic energy necessary for regenerative electric power generation is available in the vehicle. Regenerated energy is obtained by converting kinetic energy of the vehicle to electrical energy, and if the vehicle speed is low the kinetic energy is low. Thus, a regenerated energy amount cannot be expected. Whether or not the vehicle is decelerating is determined, for example, based on vehicle speed information, or based on the degree of brake pedal depression (whether the brake pedal is being depressed). If it is determined that the vehicle speed is greater than or equal to the predetermined value (10 km/h) and the vehicle is decelerating (S5050A: YES), the processing flow proceeds to step S5100A, and if this is not the case—that is, if the vehicle speed is less than the predetermined value (10 km/h) or the vehicle is not decelerating (that is, the vehicle is accelerating, traveling at a constant speed, idling, or the like)—(S5050A: NO), the control procedure immediately returns to the main flowchart in FIG. 12.

In step S5100A, power supply ECU 150 determines whether or not state of charge (SOC1) of the first battery 120 is less than or equal to a predetermined value (for example, 55%). This predetermined value (55%) is the above upper limit. If it is determined that state of charge (SOC1) of first battery 120 exceeds the predetermined value (55%) (S5100A: NO), the processing flow proceeds to step S5150A, whereas if it is determined that state of charge (SOC1) of first battery 120 is less than or equal to the predetermined value (55%) (S5100A: YES), the processing flow proceeds to step S5200A.

In step S5150A, power supply ECU 150 stops electric power generation by generator 110. Following this, the control procedure returns to the main flowchart in FIG. 12.

On the other hand, in step S5200A, power supply ECU 150 performs electric power generation control on generator 110. Specifically, power supply ECU 150 sets and outputs an output instruction value to generator 110 to a target value. Here, a "target value" is a voltage necessary to charge first battery 120. In the case of a 36 V lithium-ion battery, for example, this target value is 42 V.

Then, in step S5250A, power supply ECU 150 determines whether or not regenerated electric power generated by generator 110 is greater than or equal to a predetermined value (for example, regenerated electric power of generated current of 100 A). If generated regenerated electric power is low, electric power with which first battery 120 is charged is also low, and accurate deterioration detection cannot be expected. Regenerated electric power generated by generator 110 depends on the vehicle speed. If it is determined that generated regenerated electric power is greater than or equal to the predetermined value (S5250A: YES), the processing flow proceeds to step S5300A, whereas if it is determined that generated regenerated electric power is less than the predetermined value (S5250A: NO), the control procedure immediately returns to the main flowchart in FIG. 12.

In step S5300A, power supply ECU 150 determines whether or not state of charge SOC2 of second battery 130 is greater than or equal to 95%. The reason for this is to determine whether or not it is possible to supply electric power to electrical equipment 180 from second battery 130 when DC-DC converter 140 is temporarily stopped. If it is determined that state of charge SOC2 of second battery 130 is greater than or equal to 95% (S5300A: YES), the processing flow proceeds to step S5350A, whereas if it is determined that state of charge SOC2 of second battery 130 is less than 95% (S5300A: NO), the control procedure immediately returns to the main flowchart in FIG. 12.

In step S5350A, power supply ECU 150 stops electrically driven compressor 170. By this means, supplying regenerated energy generated by generator 110 to electrically driven compressor 170 is stopped.

Then, in step S5400A, power supply ECU 150 stops DC-DC converter 140. By this means, supplying regenerated energy generated by generator 110 to electrical equipment 180 and second battery 130 is stopped. In this state, all regenerated energy generated by generator 110 is supplied to first battery 120.

Next, in step S5450A, power supply ECU 150 performs simultaneous current and voltage measurement for first battery 120. At this time, as shown schematically in FIG. 17(A), for example, power supply ECU 150 can simultaneously measure the current and voltage of first battery 120 at the instant at which charging electric power to first battery 120 increases. The measurement of current and voltage is performed for at least two points.

Then, in step S5500A, power supply ECU 150 starts electrically driven compressor 170.

Next, in step S5550A, power supply ECU 150 starts DC-DC converter 140.

Figure 17:
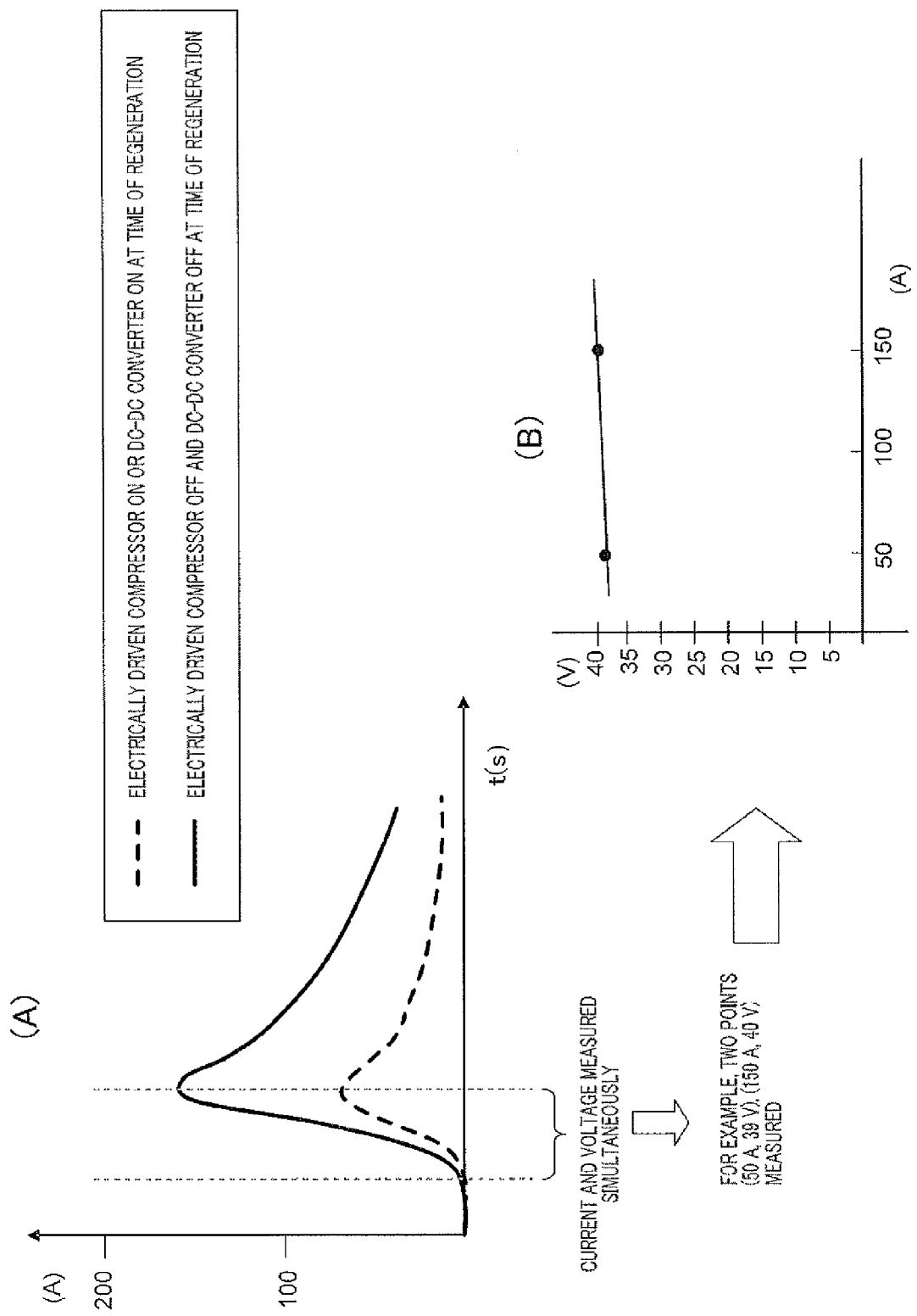
FIG. 17 comprises schematic drawings for explaining the contents of the charge-time deterioration detection processing in FIG. 16.

Then, in step S5600A, power supply ECU 150 performs deterioration determination. Specifically, power supply ECU 150 calculates internal resistance r by means of equation 1 below, using the currents and voltages of a plurality of points measured in step S5450A. Internal resistance r is one indicator of battery deterioration. For example, as shown schematically in FIG. 17(B), if current and voltage are taken as coordinate axes and measured currents and voltages of a plurality of points are plotted on the coordinate plane, the gradient of a linear approximation is internal resistance r. Solving equation 1 using measured values (50 A, 39 V) and (150 A, 40 V) of two points shown in FIG. 17 gives a value of 0.01Ω for internal resistance r. While solving equation 1 for internal resistance r requires measurements for at least two points, measurements for three or more points may be used in order to improve the accuracy of deterioration determination.

$$E + rI = V \qquad \text{(Equation 1)}$$

where E: Electromotive force
r: Internal resistance
I: Current
V: Voltage

Power supply ECU 150 compares calculated internal resistance r with a predetermined determination value, and determines whether or not there is deterioration of first battery 120. The determination result is stored in a storage apparatus such as RAM, and is also reported to the user. Following this, the control procedure returns to the main flowchart in FIG. 12.

Thus, according to this embodiment, during vehicle deceleration, the operation of other devices (for example, electrically driven compressor 170, DC-DC converter 140, and so forth) can be temporarily stopped, and first battery 120 can be charged in a concentrated fashion with regenerated energy generated by generator 110. Consequently, deterioration of first battery 120 can be detected with a high degree of accuracy.

In this embodiment, current and voltage are measured simultaneously and internal resistance is calculated as parameters for detecting battery deterioration, but the present invention is not limited to this. For example, provision may also be made for the gradient of voltage change or a drop in battery voltage to be calculated at the instant at which main battery output increases, using the method described in Patent Literature 1.

The disclosures of Japanese Patent Application No. 2010-081978, filed on Mar. 31, 2010, and Japanese Patent Application No. 2010-081979, filed on Mar. 31, 2010, including the specifications, drawings and abstracts, are incorporated herein by reference in their entirety.

INDUSTRIAL APPLICABILITY

A vehicle power supply apparatus according to the present invention is suitable for use as a vehicle power supply apparatus that can further improve the accuracy of battery deterioration detection.

REFERENCE SIGNS LIST

100 Power supply system
110 Generator
120, 130 Battery
122, 132 Current sensor
140, 172 DC-DC converter
150 Power supply ECU
160 Starter
162 Starter relay
170 Electrically driven compressor
180 General load (electrical equipment)

The invention claimed is:

1. A vehicle power supply apparatus comprising: a generator installed in a vehicle; a high-voltage first battery that is connected to the generator and stores an electric power generated by the generator; a DC-DC converter located between an electrical equipment, and a node between the generator and the first battery; a second battery that is connected to the first battery via the DC-DC converter, and that has a lower voltage than the first battery; a control section configured to cause an increased current flow through the first battery and to detect a deterioration of the first battery from the increased current flow, wherein the control section controls an operation of the DC-DC converter to cause the increased current flow through the first battery during a battery deterioration detection operation performed by the control section; a measurement section that measures the increased current flow through the first battery during the battery deterioration detection operation, in synchronization with the control of the DC-DC converter by the control section that causes the increased current flow through the first battery during the battery deterioration detection operation performed by the control section; and a determination section that determines the deterioration of the first battery using a measurement result of the measurement section, wherein the measurement section measures the increased current flow through the first battery after the control section has, during the battery deterioration detection operation, temporarily stopped the DC-DC converter during a vehicle deceleration.

2. The vehicle power supply apparatus according to claim 1, wherein:
the first battery is a nickel-hydride battery, a lithium-ion battery, or a lead battery; and
the second battery is a lead battery.

3. The vehicle power supply apparatus according to claim 1, wherein:
an electrically driven compressor is connected to the first battery; and
the control section temporarily stops an operation of the electrically driven compressor and the DC-DC converter during the vehicle deceleration.

4. The vehicle power supply apparatus according to claim 1,
wherein the measurement section measures the increased current flow and a voltage of a plurality of points for the first battery in synchronization with the control of the DC-DC converter by the control section.

5. The vehicle power supply apparatus according to claim 4, wherein the determination section calculates an internal resistance of the first battery using a measurement result of the measurement section, compares the internal resistance with a predetermined determination value, and determines the deterioration of the first battery.

* * * * *